(12) United States Patent
Domoto et al.

(10) Patent No.: US 10,580,927 B2
(45) Date of Patent: Mar. 3, 2020

(54) PROCESS OF FORMING LIGHT-RECEIVING DEVICE

(71) Applicant: SUMITOMO ELECTRIC DEVICE INNOVATIONS, INC., Yokohama-shi (JP)

(72) Inventors: Shin-ichi Domoto, Yokohama (JP); Takumi Endo, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 15/907,590

(22) Filed: Feb. 28, 2018

(65) Prior Publication Data

US 2018/0254373 A1 Sep. 6, 2018

(30) Foreign Application Priority Data

Mar. 1, 2017 (JP) ................. 2017-038793

(51) Int. Cl.
| | |
|---|---|
| *H01L 31/18* | (2006.01) |
| *H01L 31/107* | (2006.01) |
| *H01L 31/0224* | (2006.01) |
| *H01L 31/0352* | (2006.01) |
| *H01L 31/0232* | (2014.01) |
| *H01L 21/223* | (2006.01) |

(52) U.S. Cl.
CPC .. *H01L 31/1844* (2013.01); *H01L 31/022408* (2013.01); *H01L 31/022416* (2013.01); *H01L 31/03529* (2013.01); *H01L 31/035281* (2013.01); *H01L 31/107* (2013.01); *H01L 31/1075* (2013.01); *H01L 21/2233* (2013.01); *H01L 31/02327* (2013.01); *Y02P 70/521* (2015.11)

(58) Field of Classification Search
CPC combination set(s) only.
See application file for complete search history.

(56) References Cited

U.S. PATENT DOCUMENTS

| | | | | |
|---|---|---|---|---|
| 5,656,831 A | * | 8/1997 | Kusakabe | ........... H01L 31/1075 257/15 |
| 2011/0281406 A1 | * | 11/2011 | Ogino | ................... H01L 29/045 438/138 |

FOREIGN PATENT DOCUMENTS

| | | |
|---|---|---|
| JP | H11-354827 A | 12/1999 |
| JP | 2005-086028 A | 3/2005 |
| JP | 2008-252145 A | 10/2008 |

* cited by examiner

*Primary Examiner* — Zandra V Smith
*Assistant Examiner* — Andre C Stevenson
(74) *Attorney, Agent, or Firm* — Baker Botts, L.L.P.; Michael A. Sartori

(57) ABSTRACT

A process of forming a light-receiving device type of avalanche photodiode (APD) is disclosed. The process includes steps of: (1) growing semiconductor layers on a semiconductor substrate, the semiconductor layers providing a first area on a top thereof; (2) thermally diffusing impurities within the semiconductor layers in a second area outside of the first area so as to leave a roughed surface in a top of the second area, the impurities laterally diffusing to form an diffusion edge locating inside of the first area; and (3) removing the semiconductor layers including the roughed surface thereof in the second area to form a mesa in the first area, the mesa including the diffusion edge in a periphery thereof but excluding the roughed surface.

13 Claims, 11 Drawing Sheets

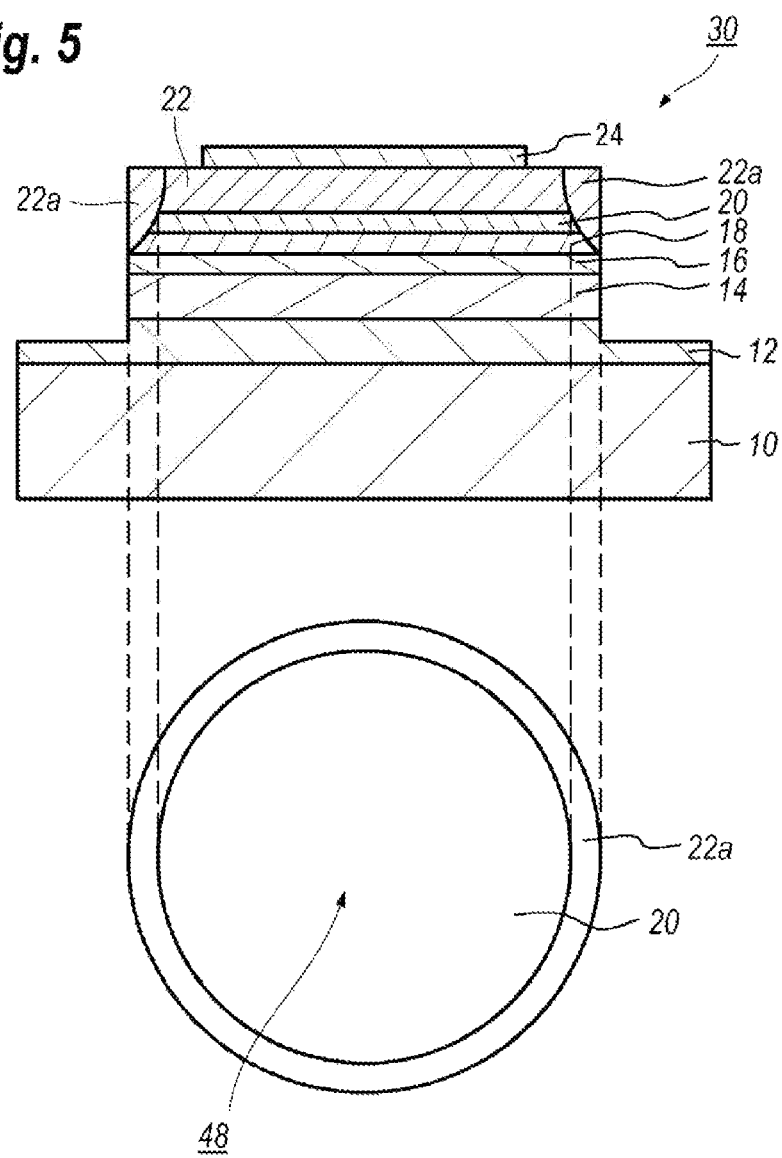

PROCESS OF FORMING LIGHT-RECEIVING DEVICE

BACKGROUND

1. Field of Invention

The present invention relates to a process of forming a light-receiving device.

2. Background Arts

It has been well known in the field that an avalanche photodiode having a planar type accompanied with a guard ring or having a mesa to secure electrical isolation. In a light-receiving device with a mesa including a light sensitive area, a process of forming a guard ring by thermally diffusing impurities around the mesa possibly causes a roughed surface due to the diffusion of the impurities. The roughed surface scatters light entering the light sensitive area and/or disturbs field distribution, which degrades the sensitivity and the high-speed response of the light-receiving device. The present application provides a process to securely remove a roughed surface in the periphery of the mesa.

SUMMARY

An aspect of the present invention relates to a process of forming a light-receiving device. The process includes steps of: (a) growing semiconductor layers on a semiconductor substrate; (b) thermally diffusing impurities within the semiconductor layers in a second area outside of the first area; and (c) removing the semiconductor layers including the roughed surface thereof in the second area. The first step (a) forms a first area on a top of the semiconductor layers. The second step (b) leaves a roughed surface in a top of the second area, while, the impurities laterally diffuse into the first area as forming a diffusion edge that locates inside of the first area. The step (c) forms a mesa in the first area including the diffusion edge in a periphery of the mesa but excludes the roughed surface.

BRIEF DESCRIPTION OF THE DRAWINGS

The foregoing and other purposes, aspects and advantages will be better understood from the following detailed description of a preferred embodiment of the invention with reference to the drawings, in which:

FIG. 5 shows a cross section and a plan view of a mesa according to the first embodiment;

DESCRIPTION OF EMBODIMENT

Next, some embodiments according to the present invention will be described as referring to accompanying drawings. The present invention, however, is not restricted to those embodiments, and it is not intended to be exhaustive or to limit the invention to the precise forms to be disclosed. Obviously, many modifications and variations will be apparent to practitioners skilled in this art. It is intended that the scope of the invention be defined by the following claims and their equivalents. Also, in the description of the drawings, numerals or symbols same with or similar to each other will refer to elements same with or similar to each other without duplicating explanations.

First Embodiment

Figure 11:
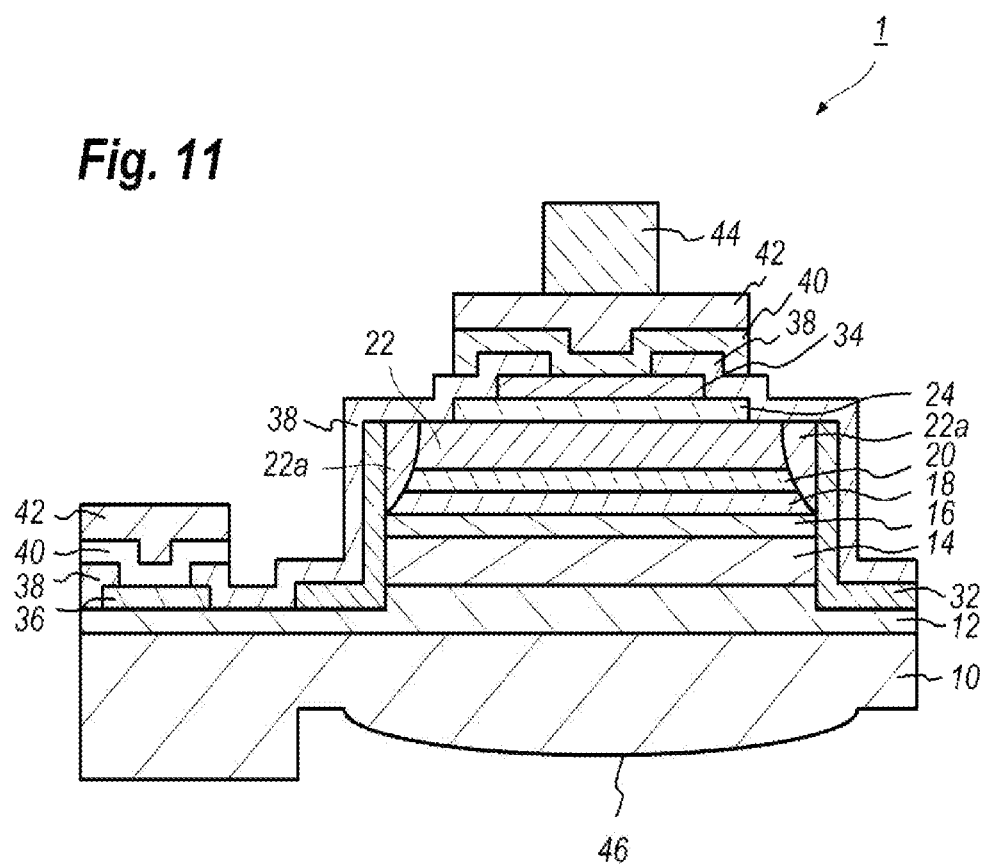
FIG. 11 shows a cross section of a light-receiving device according to the present invention.

FIG. 11 shows a cross section of a light-receiving device 1 according to an embodiment of the present invention. The light-receiving device 1, which has a type of avalanche photodiode (APD), includes a stack of semiconductor layers on a semiconductor substrate 10, where the semiconductor layers includes, from a side of the semiconductor substrate 10, a connecting layer 12, an absorption layer 14, a multiplication layer 20, a window layer 22, and a contact layer 24. The stack of the layers may further include a buffer layer 16 and an intermediate layer 18 between the absorption layer 14 and the multiplication layer 20. The layers from the connecting layer 12 to the window layer 22 form an active mesa for receiving photons illuminating a back surface of the semiconductor substrate 10. The mesa provides an electrode 34 on a top thereof and a cover layer 32 in respective sides thereof. The electrode 34 and the cover layer 32 are covered with a passivation film 38 that provides a window in the top of the mesa to expose the electrode 34 therein.

The light-receiving device 1 further provides another electrode 36 neighbor to the mesa, where the other electrode 36 is in contact with the connecting layer 12. The passivation film 38 also provides a window that exposes the top of the other electrode 36. Metal layers 42 are in contact with the electrodes, 34 and 36, through barrier layers 40. The electrode 34 in the top of the mesa may provide a bump 44 on the top of the metal layer 42.

The connecting layer 12, which may be made of n-type indium phosphide (InP), electrically connects the absorption layer 14 in a back surface thereof with the other electrode 36. The absorption layer 14, which may be made of n-type indium gallium phosphide (InGaAs), absorbs photons entering through the semiconductor substrate 10 and generates a pair of carriers, one of which is provided to the other electrode 36 through the connecting layer 12, while, the other of the paired carriers is provided to the multiplication layer 20 through the buffer layer 16 and the intermediate layer 18. The buffer layer 16, which may be made of indium gallium arsenide phosphide (InGaAsP), compensates, or moderates a bandgap discrepancy between the absorption layer 14 and the multiplication layer 20. The intermediate layer 18, which may be made of n-type InP, relaxes or moderates strength of an electric field induced in the multiplication layer 20. The multiplication layer 20 may multiply carriers generated in the absorption layer and transported therein. The multiplication layer 20 may be made of n-type InP. The window layer 22 may be made of p-type InP. Thus, the multiplication layer 20 and the window layer 22 may form a p-n junction in an interface therebetween. The contact layer 24, which may be made of heavily doped p-type InGaAs to reduce contact resistance of the electrode 34. Thus, the electrode 34 of the light-receiving device 1 shown in FIG. 11 is a p-type electrode, while, the other electrode 36 in contact with the connecting layer 12 is an n-type electrode.

Next, a process of forming the semiconductor light-receiving device according to the first embodiment will be described as referring to the drawings. FIG. 1A to FIG. 3B show cross sections of the light-receiving device 1 at respective steps of the process thereof that are according to the first embodiment of the present invention. First, the process sequentially grows, on a semiconductor substrate 10, the connecting layer 12 made of n-type indium phosphide (n-InP), the absorption layer 14 made of n-type indium gallium arsenide (InGaAs), the buffer layer 16 made of n-type indium gallium arsenide phosphide (InGaAsP), the intermediate layer 18 made of n-type InP, the multiplication layer 20 made of n-type InP, a window layer 22 of p-type InP, and the contact layer 24 made of p-type InGaAs. Then, the layers, 12 to 24, thus grown are covered with a first insulating film 26 made of silicon oxide ($SiO_2$). The process further forms a photoresist 50 with a circular pattern, but not restricted to the circular pattern, on the first insulating film 26.

The semiconductor substrate 10 has a thickness of about 350 μm and the layers from the connecting layer 12 to the contact layer 24 preferably have thicknesses of, 1.0 μm, 1.0 μm, 0.05 μm, 0.05 μm, 0.05 μm, 1.0 μm, and 0.3 μm, respectively. The first insulating film 26 preferably has a thickness of about 0.6 μm.

Figure 1A:
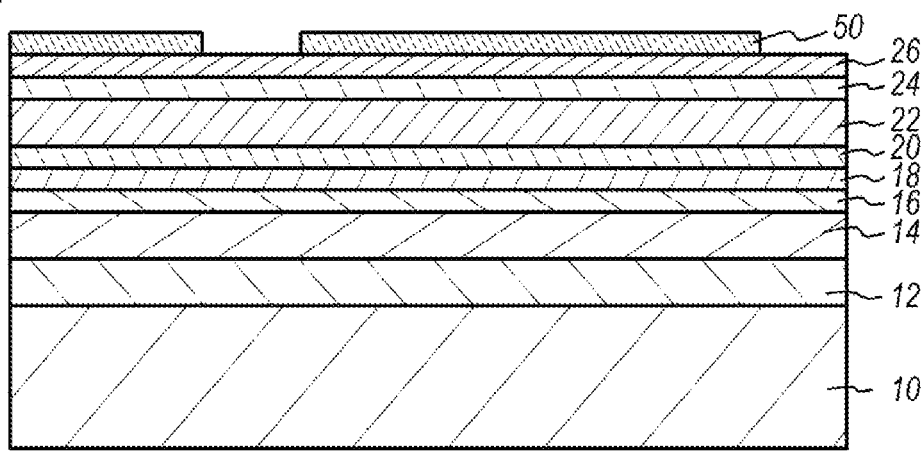
FIG. 1A to FIG. 1C show cross sections of a light-receiving device according to the first embodiment of the present invention at respective steps of forming the light-receiving device.
Figure 1B:
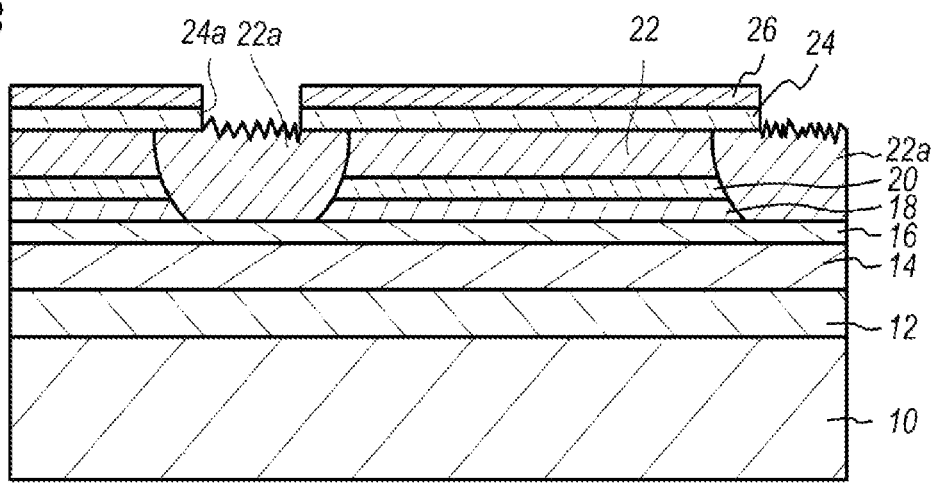

Thereafter, portions of the first insulating film 26 exposed from the patterned photoresist 50 are removed using the patterned photoresist 50 as an etching mask. Removing the patterned photoresist 50, portions of the contact layer 24 exposed from the first insulating film 26 are etched using the first insulating film 26 as another etching mask, as shown in FIG. 1B. Because the patterned photoresist 50 has a substantial circular shape, the first insulating film 26 and the contact layer 24 also have a substantial circular shape. An area on a top of the layers covered with the first insulating film 26 may be called as the first area of the semiconductor layers, while, another area outside of the first area may be called as the second area thereof. These two-step etchings may form a window 24a in the contact layer 24 made of p-InGaAs and also the first insulating film 26.

Then, the semiconductor substrate 10 with the semiconductor layers, 12 to 24, grown thereon are heat-treated within an atmosphere that contains p-type dopants for forming the guard ring region 22a. Conditions of the heat-treatment are, for instance, a temperature of 600° C., a pressure of $6.0 \times 10^{-3}$ Torr, and a period for 30 minutes. The heat-treatment may form the guard ring region 22a at least in the window layer 22, the multiplication layer 20, and the intermediate layer 18, where those layers are originally grown in the n-type conduction, as doping with the p-type dopants contained in the atmosphere. The guard ring region 22a extends from the window layer 22 to the intermediate layer 18, that is, the heat treatment may further dope the window layer 22 with the p-type dopant and may convert the multiplication layer 20 and the intermediate layer 18 each made of n-type InP into the p-type guard ring region 22a by diffusing the p-type dopants therein from the window 24a. The doping or the diffusion of the p-type dopants may be substantially stopped at the buffer layer 16 made of n-type InGaAsP. The p-type dopants may laterally diffuse along the semiconductor layers. Accordingly, the guard ring region 22a is expanded in portions of the window layer 22, the multiplication layer 20, and the intermediate layer 18 that are beneath the contact layer 24 along the window 24a as forming a diffusion edge in the first area under the first insulating film 26. The heat treatment also makes rough in a surface of the window layer 22 exposed within the window 24a. The conditions of the heat treatment are not restricted to those described above. A temperature higher than 600° C., a pressure between $5.0 \times 10^{-3}$ to $7 \times 10^{-3}$ Torr, and a period longer than 20 minutes but shorter than 40 minutes are preferable for the heat treatment to diffuse p-type dopants from the window 24a to the semiconductor layers. Various p-type dopants are known in the field, for instance, zinc (Zn), cadmium (Cd), and magnesium (Mg) are used as the p-type dopant.

Figure 1C:
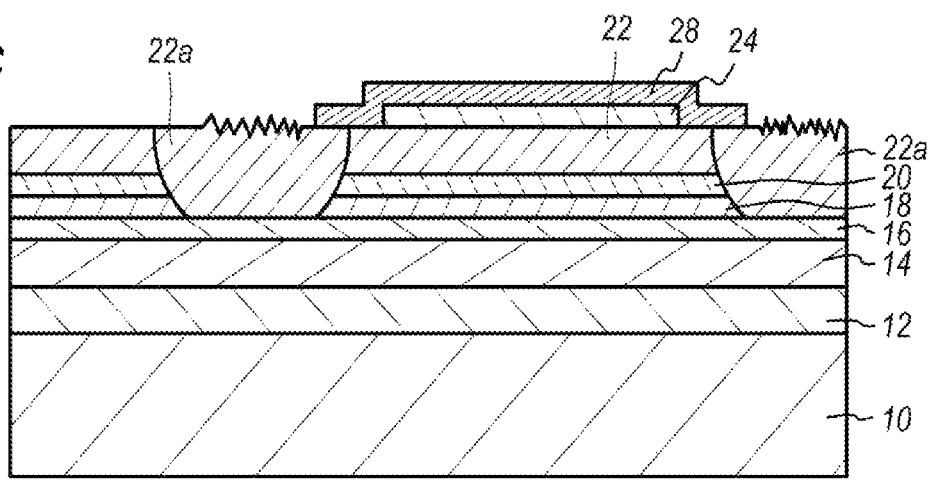

Thereafter, removing the first insulating film 26, the contact layer 24 is partially etched using another patterned photoresist as shown in FIG. 1C. That is, the etching of the contact layer 24 may narrow the contact layer 24 with the circular plane shape, or makes a diameter of the circular shape smaller, so as to expose the diffusion edge in the guard ring region 22a and the top of the window layer 24 next to the diffusion edge, where a primary portion of the light-receiving device 1 is to be formed in the active mesa. Then, the process forms the second insulating layer 28 so as to cover the diffusion edge of the guard ring region 22a but expose the roughed surface of the window layer 22, as shown in FIG. 1C. Specifically, the second insulating film 28 may also have a circular pattern with a diameter smaller than a diameter of the first insulating film 26, which means that the second insulating film 28 may cover the narrowed contact layer 24, the window layer 22 in the periphery of the narrowed contact layer 24, and a portion of the guard ring region 22a outside of the exposed window layer 22 but expose the roughed surface of the guard ring region 22a. The second insulating film 28 may be made of, for instance, silicon dioxide ($SiO_2$).

Figure 4:
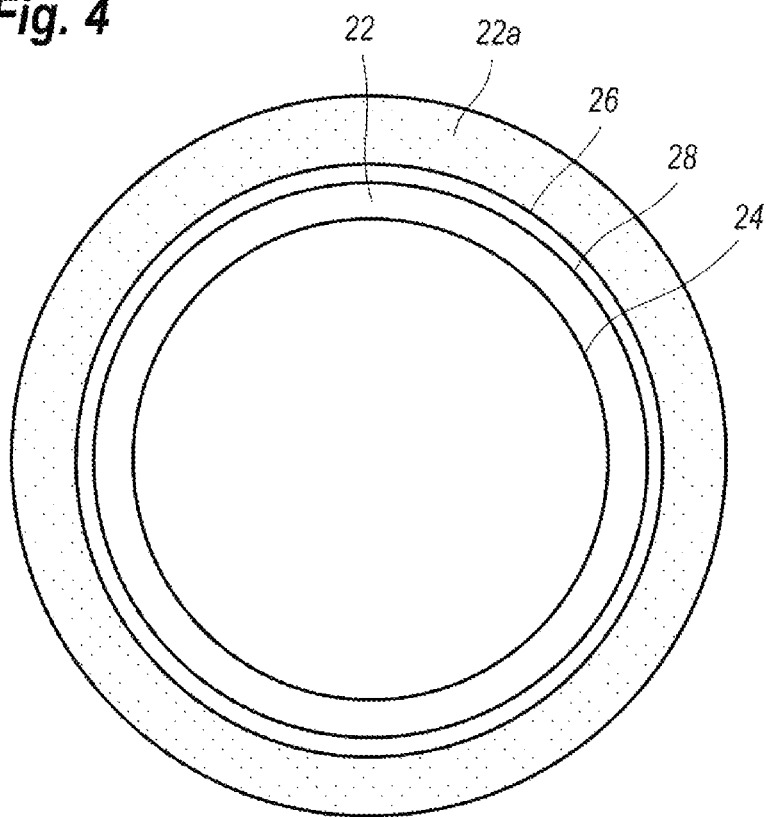
FIG. 4 is a plan view showing a planar relation of the contact layer, the first and second insulating films, and the guard ring region surrounding the contact layer.

FIG. 4 shows a plan view explaining a relation between the first insulating film 26 shown in in FIG. 1B and the second insulating film 28 shown in FIG. 1C. FIG. 4 also indicates the narrowed contact layer 24, the portion of the window layer 22 exposed in the periphery of the contact layer 24 and covered with the second insulating film 28, and the guard ring region 22a around the exposed window layer 22, which is the diffusion edge. As shown in FIG. 4, the first and second insulating films, 26 and 28, the narrowed contact layer 24, the window layer 22, and the guard ring region 22a in respective peripheries thereof form concentric circles.

Figure 2A:
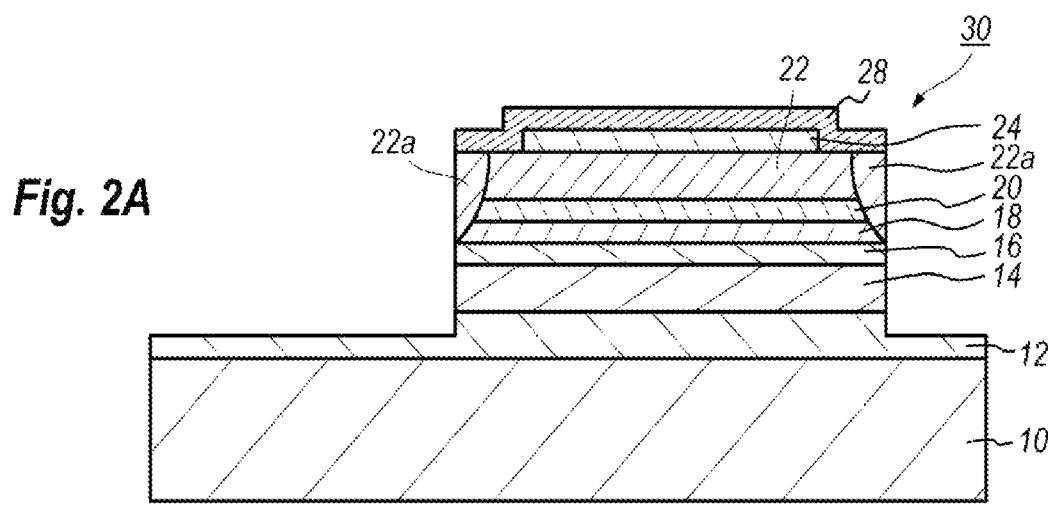
FIG. 2A to FIG. 2C show cross sections of the light-receiving device at respective steps of forming the light-receiving device subsequent to the step shown in FIG. 1C.

Further describing the process for forming the light-receiving device 1, a dry-etching of the inductive coupled plasma (ICP) using the second insulating film 28 as an etching mask may remove the layers from the window layer 22 to a portion of the connecting layer 12 so as to form a mesa 30, as shown in FIG. 2A. Because the second insulating film 28 partially covers the guard ring region 22a; the mesa 30 provides the guard ring region 22a with the p-type conduction in the sides of the intermediate layer 18 and the multiplication layer 20. Conditions of the ICP etching process are the following; for instance, power of microwave plasma is 200 W; a bias of the plasma is 100 W; a reactive gas is silicon tetrachloride ($SiCl_4$) accompanied with argon (Ar) as a carrier gas; pressure is 0.5 to 0.7 Pa; and a temperature is from 150 to 250° C.

FIG. 5 shows a cross section of the mesa 30 and a plan view thereof. The mesa 30 has a circular shape accompanied with the guard ring region 22a in the periphery of the intermediate layer 18 and the multiplication layer 20 that are made of n-type InP where the multiplication layer 20 surrounded by the guard ring region made of p-type InP may operate as a light sensitive area 48.

Figure 2B:
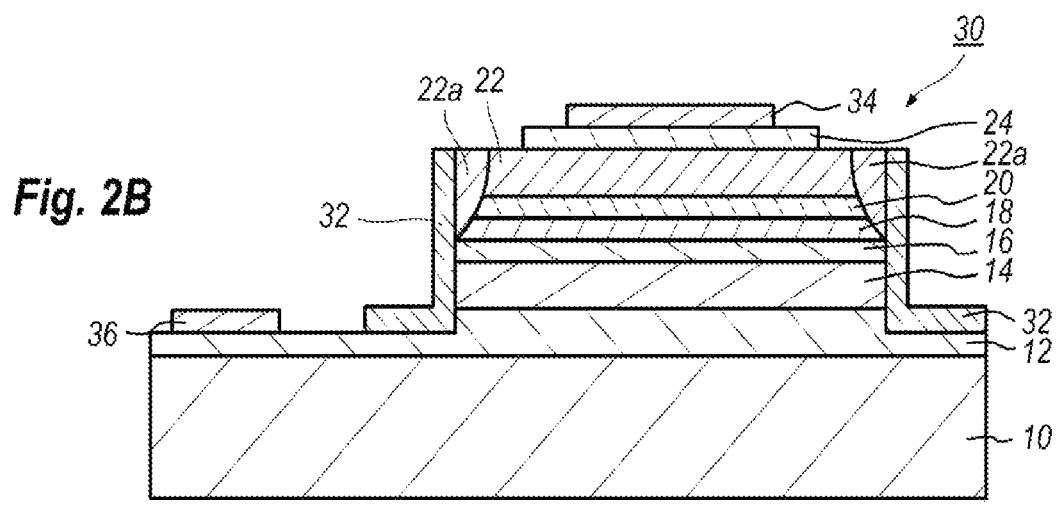

Referring back to FIG. 2A, the process according to the first embodiment may selectively form the cover layer 32 made of InP in a side of the mesa 30 and a surface of the connecting layer 12, where the cover layer 32 is not grown on the second insulating film 28. Specifically, the cover layer 32 may be epitaxially grown under conditions of, phosphine ($PH_3$) atmosphere, a temperature of 600° C., and a growth rate of 2.0 µm/h. Then, removing the second insulating film 28, a p-type electrode 34 made of stacked metal of zinc (Zn) and gold (Au) is alloyed on the contact layer 24, while an n-type electrode 36 made of eutectic alloy of gold and germanium (AuGe) is formed on the connecting layer 12 as shown in FIG. 2B.

Figure 2C:
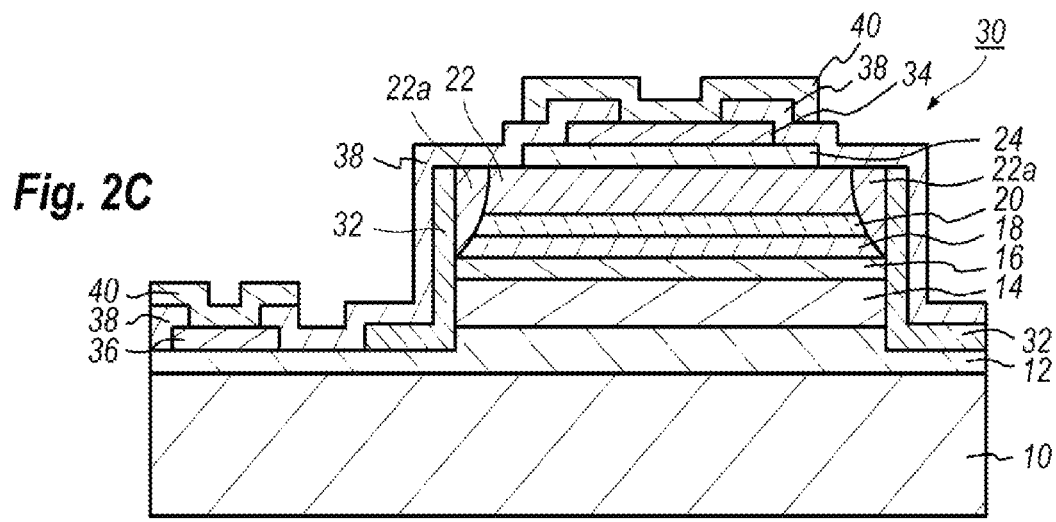

Finally, a passivation film 38, which may be made of silicon nitride ($Si_3N_4$) is deposited so as to cover the mesa 30. Removing portions of the passivation film 38 on the p-type electrode 34 and the n-type electrode 36 so as to expose the p-type and n-type electrodes, 34 and 36, respectively, barrier metals 40 made of stacked metals of titanium (Ti) and gold (Au) are formed such that the barrier metals 40 are in contact with the p-type and n-type electrodes, 34 and 36, respectively, as shown in FIG. 2C.

Figure 3A:
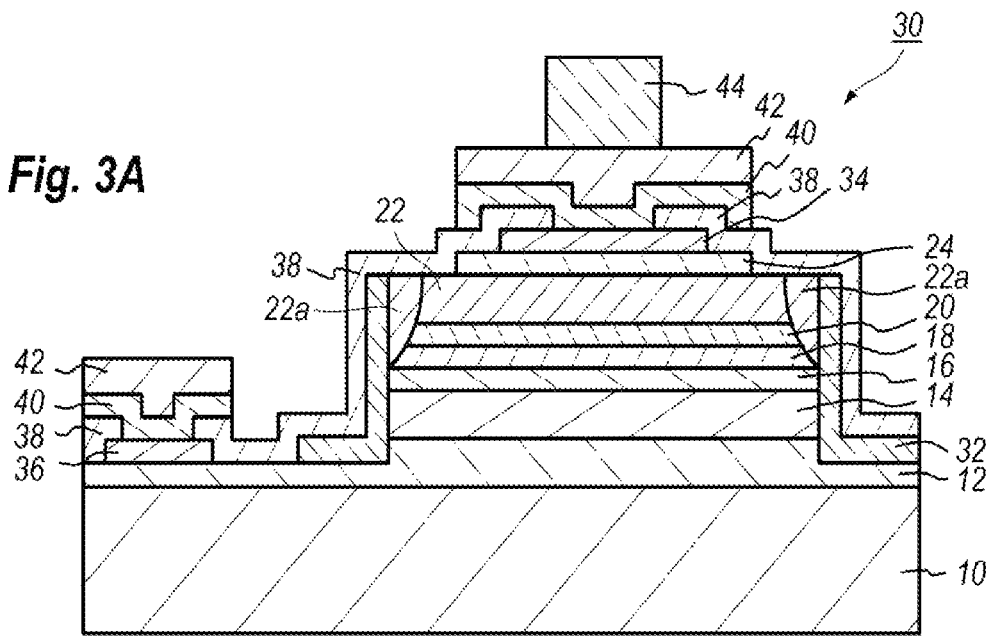
FIG. 3A and FIG. 3B show cross sections of the light-receiving device at respective steps of forming the light-receiving device subsequent to the step shown in FIG. 2C.
Figure 3B:
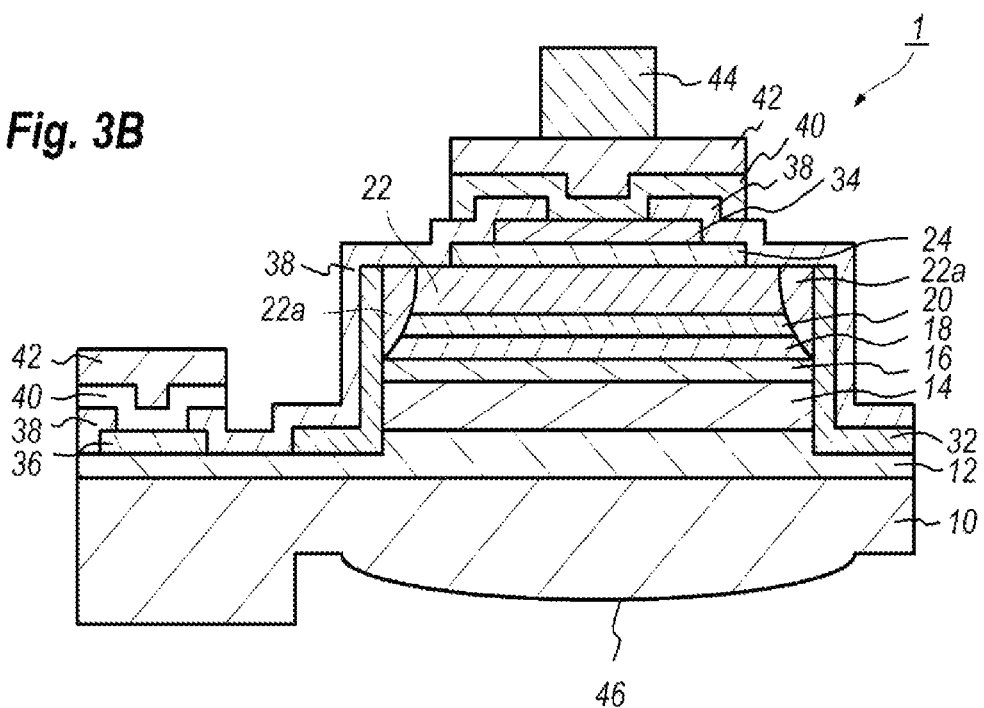

The process may finally form a metal layer 42 made of primarily gold (Au) so as to be in contact with the barrier metal 40 and a bump metal 44 made of gold tin (AuSn) on the metal layer 42 as shown in FIG. 3A. Finally, the semiconductor substrate 10 in the back surface thereof opposite to the surface on which the semiconductor layers, 12 to 24, are grown thereon is thinned then formed in a lensed shape 46. The light-receiving device 1 of the type of avalanche photodiode (APD) with the back-illumination may be formed as shown in FIG. 3B.

Figure 9A:
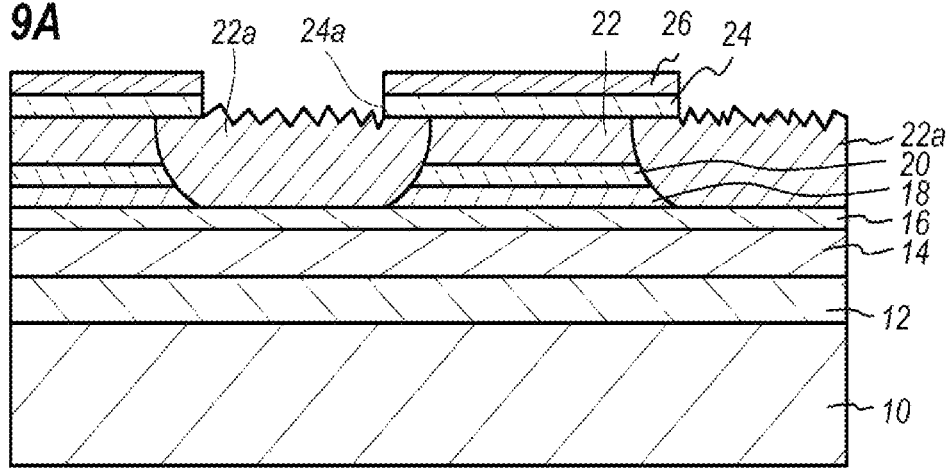
FIG. 9A to FIG. 9C show cross sections of a light-receiving device at respective steps of a conventional process.
Figure 9B:
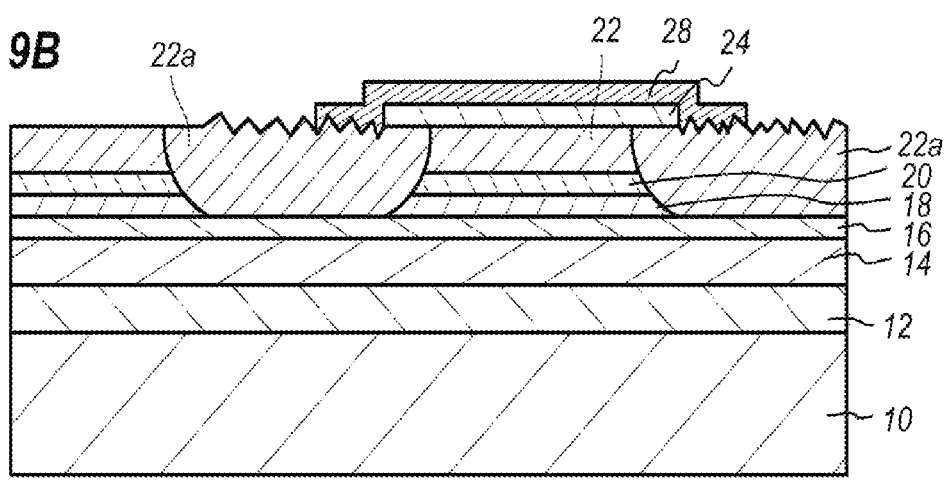
Figure 9C:
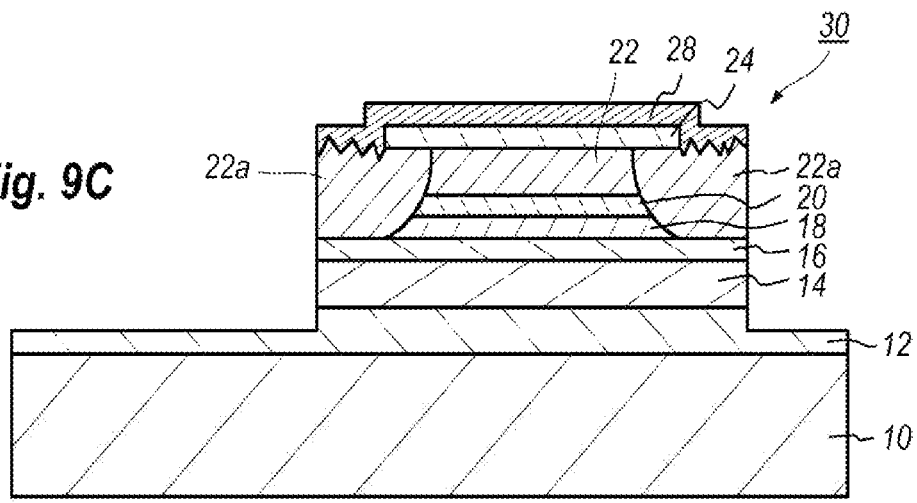

FIG. 9A to FIG. 9C show cross sections of a light-receiving device at respective steps of a conventional process that is comparable to the present process. The conventional process also takes steps same with those shown in FIG. 1A and FIG. 1B of the present invention. Referring to FIG. 9B, removing the first insulating film 26, the process subsequently forms the second insulating film 28 that covers the first insulating film 26 without narrowing the contact layer 24. Thereafter, the second insulating film 28 outside the region where the mesa is to be formed is removed using a photoresist with a circular pattern corresponding to a plane shape of the mesa. The semiconductor layers are etched using, for instance, the ICP-RIE from the window layer 22 to expose the connecting layer 12. Thus, the mesa 30 is formed. The mesa 30 formed by the conventional process includes, from the top thereof, the contact layer 24, the window layer 22, the multiplication layer 20, the intermediate layer 18, the buffer layer 16, the absorption layer 14, and a portion of the connecting layer 12. Thereafter, the steps shown in FIG. 2B to FIG. 3B are carried out to form a light-receiving device.

The convention process, as shown in FIG. 9A to FIG. 9C, the second insulating film 28 that is used at the formation of the mesa 30 has a diameter greater than a diameter of the first insulating film 26 that is used for diffusing the p-type dopants. Accordingly, the mesa 30 that is formed using the second insulating mask 28 leaves roughed surface in the top thereof. The roughed surface may cause a scattering of incident photons and/or inhomogeneity distribution of the electric field in the multiplication layer 20.

Figure 10:
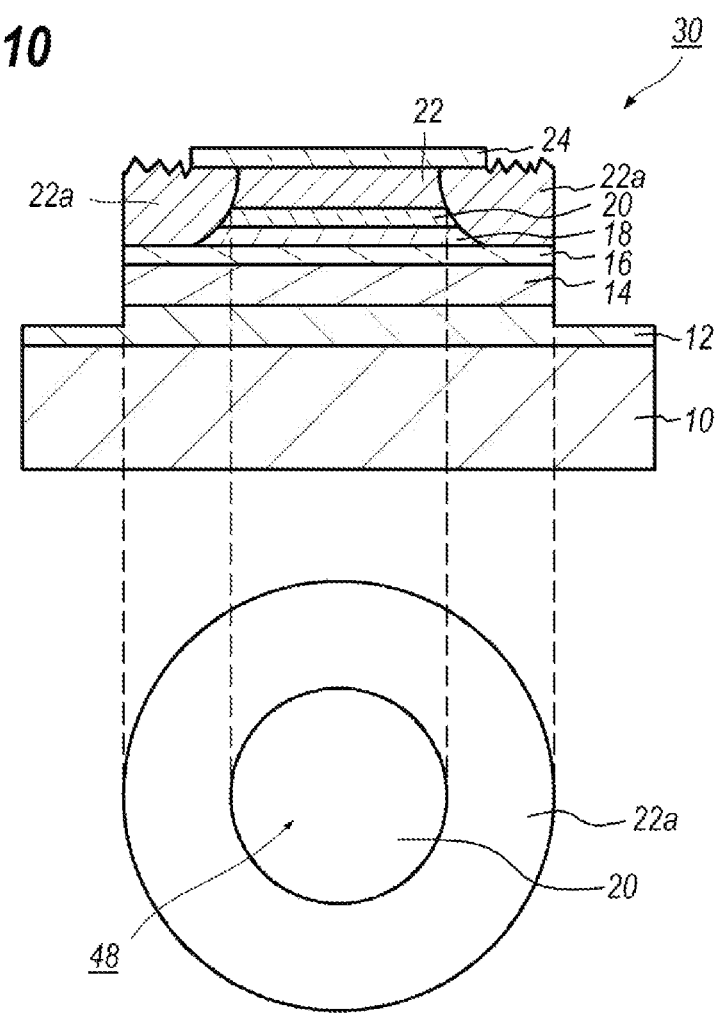
FIG. 10 shows a cross section and a plan view of the mesa according to the conventional process.

FIG. 10 shows a cross section of a light-receiving device formed by the conventional process and a plane shape of the multiplication layer 20 formed by the conventional process. The mesa 30 formed by the conventional process enlarges the guard ring region 22a, which results in a narrowed window layer 22 and also a narrowed multiplication layer 20. In other words, the mesa 30 formed by the conventional process has a narrowed light sensitive area 48 that corresponds to an area of the multiplication layer 20. Accordingly, the mesa 30 shown in FIG. 10 possibly degrades the sensitivity and the high-speed response thereof.

On the other hand, the light-receiving device 1 formed by the present invention, as shown in FIG. 4, the second insulating film 28 for forming the mesa 30 in the periphery thereof substantially traces the periphery of the first insulating film 26 for thermally diffusing the impurities; or locates inside of the periphery of the first insulating film 26. The second insulating film 28 in respective cases above inevitably covers the diffusion edge of the guard ring region. Accordingly, the etching using the second insulating film 28 may form the mesa 30 with the guard ring region 22a thermally doped with p-type impurities but without the roughed surface on the top of the guard ring region 22a. Besides, the mesa 30 may leave the multiplication layer 20 with a widened area; that is, the ratio of the area of the multiplication layer 20 against the plane area of the mesa 30 becomes large, which means the light sensitive area 48 may also become large.

The second insulating film 28 is preferably formed in the area inside of the area of the first insulating film 26, which securely removes the roughed surface on the top of the mesa 30. Also, the process of the present invention removes the first insulating film 26 formed on the contact layer 24 after the thermal diffusion of the p-type impurities. Then, the second insulating film 28 is formed so as to cover the contact layer 24 that is narrowed by the process of removing the first insulating film 26 and the diffusion edge of the guard ring region 22a. Finally, the mesa 30 is formed by etching the semiconductor layers using the second insulating film 28 as the etching mask. Thus, the process according to the present invention may form the contact layer 24 securely narrower than the mesa 30.

Second Embodiment

Figure 6A:
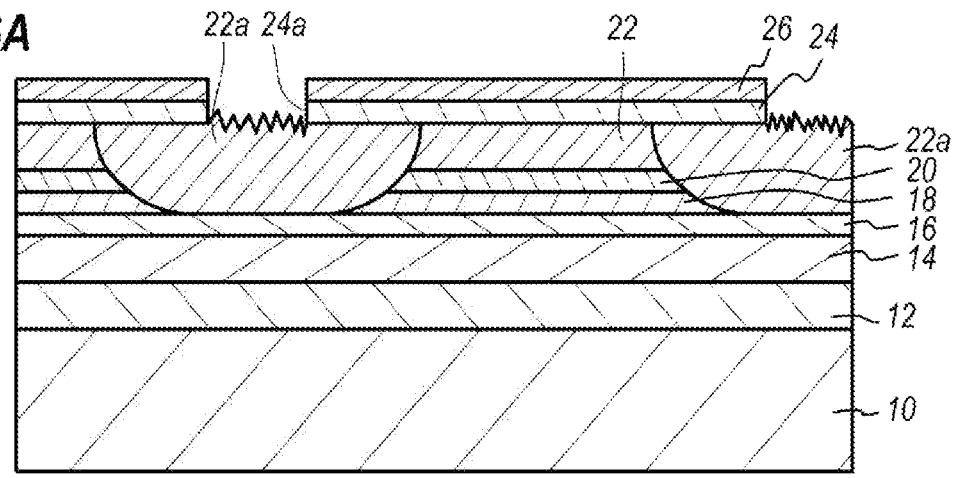
FIG. 6A to FIG. 6C show cross sections of a light-receiving device at respective steps of another process according to the second embodiment of the present invention.
Figure 6B:
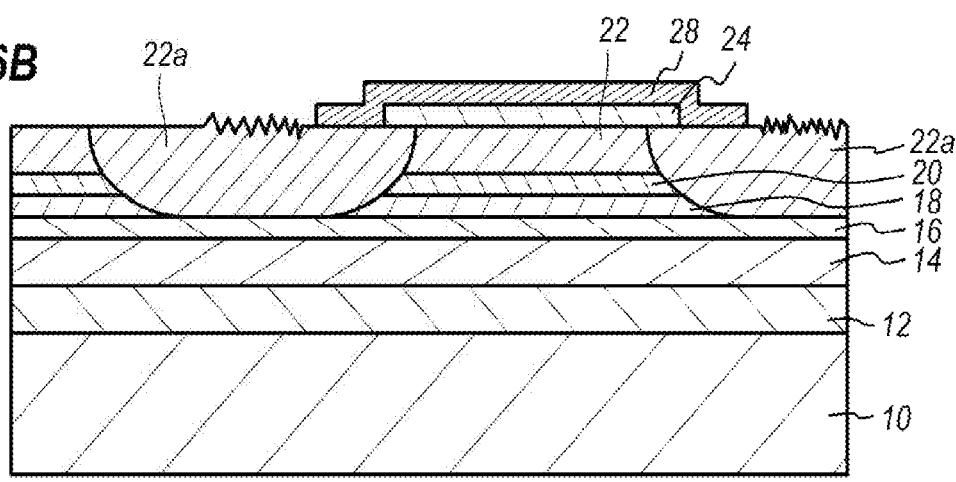
Figure 6C:
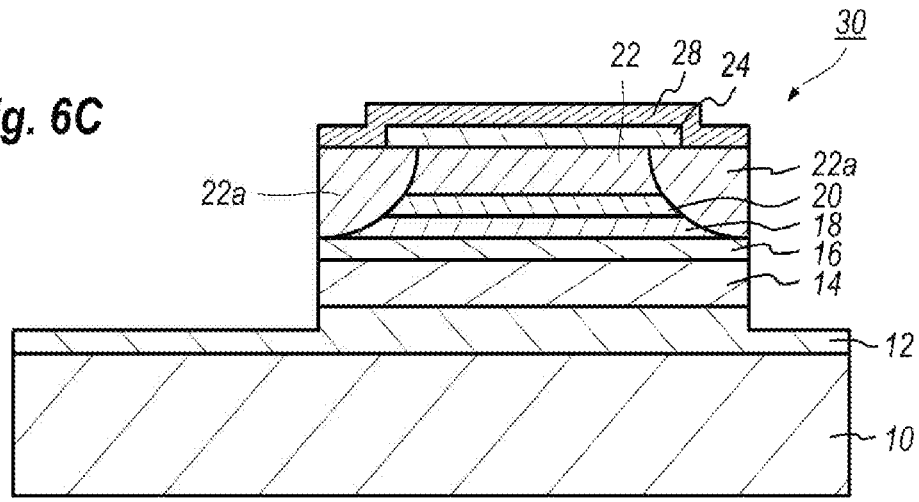

FIG. 6A to FIG. 6C show cross section of another APD at respective steps of the process according to the second embodiment of the present invention. The second embodiment has a feature distinguishable from that of the first embodiment in that the conditions of the heat treatment for diffusing the p-type impurities are different from those of the first embodiment. That is, the heat treatment of the second embodiment is carried out at 600° C. under the pressure of $2.0 \times 10^{-3}$ Torr, which are same as those of the first embodiment, but a period thereof is for 90 minutes longer than that of the first embodiment. A longer heat treatment may accelerate the lateral diffusion of the p-type impurities, which results in the guard ring region 22a expanded laterally in the multiplication layer 20 under the first insulating film 26.

As shown in FIG. 6B, removing the first insulating film 26, the contact layer 24 is etched using a photoresist as an etching mask to narrow the contact layer 24 under which the mesa 30 is to be formed. Thereafter, forming the second insulating film 28 that covers the narrowed contact layer 24, the second insulating film 28 is etched so as to form a circular plane shape. The second insulating film 28 is formed so as to substantially trace the first insulating film 26, or slightly narrower than the first insulating film 26. The second insulating film 28 is formed also so as to cover the extended guard ring region 22a.

Thereafter, as shown in FIG. 6C, the reactive ion etching (RIE) process using the induction coupled plasma (ICP) forms the mesa 30 by etching the semiconductor layers until the connecting layer 12 expose. The mesa 30 thus formed includes the connecting layer 12, the absorption layer 14, the buffer layer 16, the intermediate layer 18, the multiplication layer 20, the window layer 22, and the contact layer 24. Thereafter, process shown in figures from FIG. 2B to FIG. 3B of the first embodiment are carried out.

Figure 7:
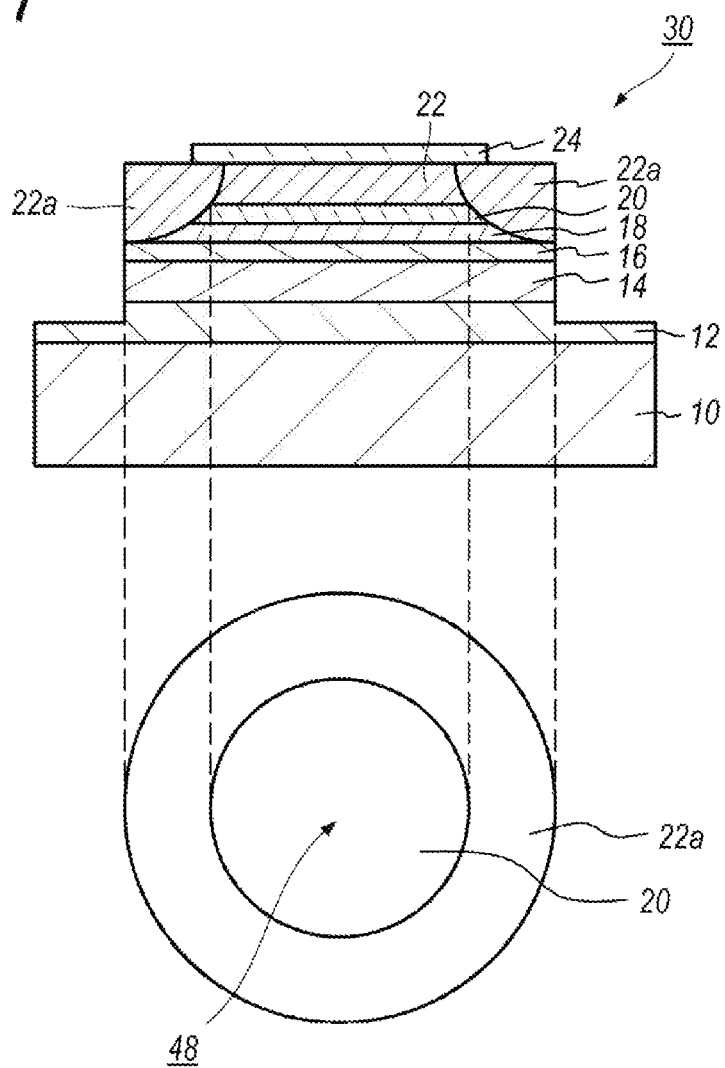
FIG. 7 shows a cross section and a plan view of the mesa according to the second embodiment.

FIG. 7 schematically shows the mesa 30 in the cross section and the plan view thereof. The second embodiment of the present invention, as explained in FIG. 6A, the heat treatment for diffusing the p-type impurities takes conditions for accelerating the lateral diffusion of the p-type impurities; accordingly, the guard ring region 22a formed in the periphery of the window layer 22 expands compared with that of the first embodiment. Thus, the light-receiving device 1 may effectively suppress breakdown caused in the edge of the mesa 30. The conditions for accelerating the lateral diffusion of the p-type impurities are not restricted to those described above. A temperature higher that 600° C., a pressure higher than $1.0 \times 10^{-3}$ Torr but lower than $3.0 \times 10^{-3}$ Torr and a period longer than 80 minutes but 100 minutes at longest are applicable to the heat treatment.

Third Embodiment

Figure 8A:
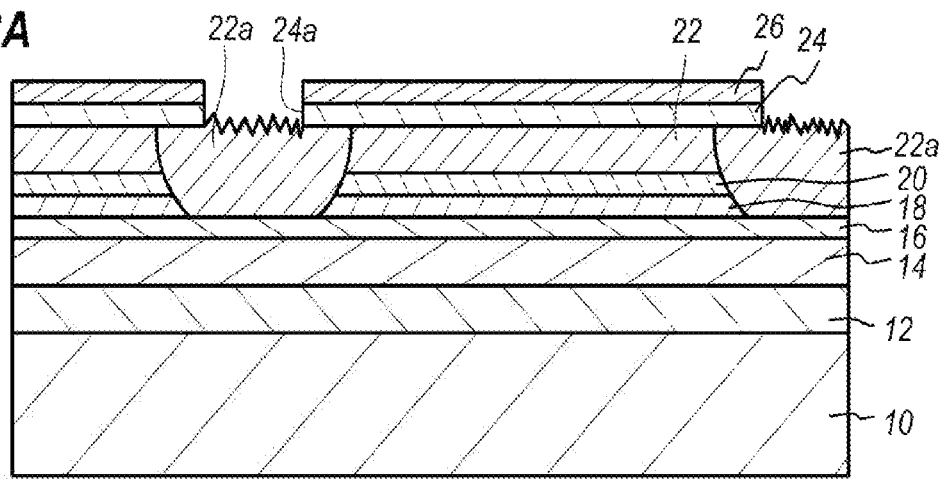
FIG. 8A to FIG. 8C show cross sections of a light-receiving device at respective steps of still another process according to the third embodiment of the present invention.
Figure 8B:
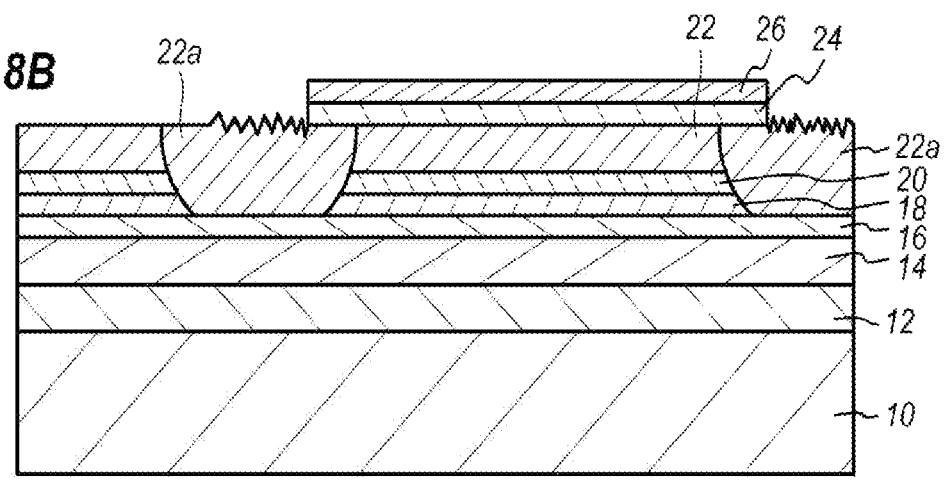
Figure 8C:
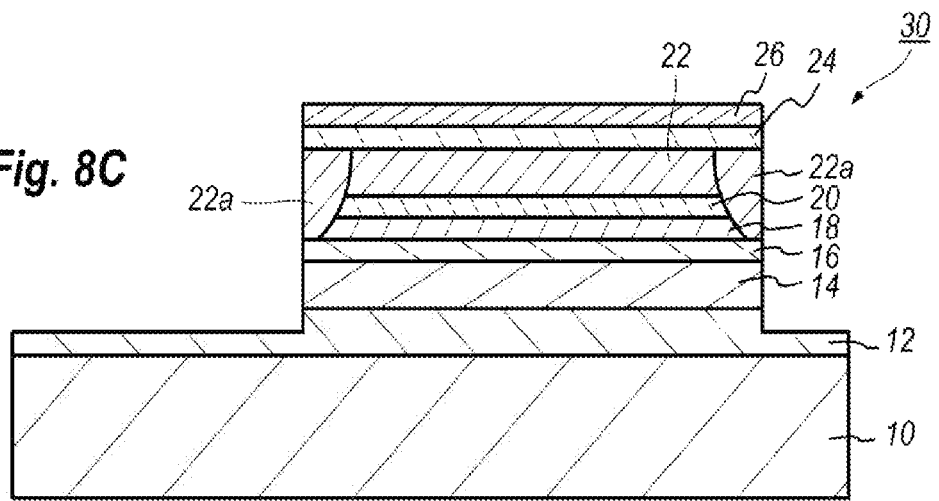

Cross section of the light-receiving device 1 at respective steps of the process for forming the light-receiving device 1 according to the third embodiment of the present invention are shown in FIG. 8A to FIG. 8C. The process of the third embodiment takes the steps shown in FIG. 1A and FIG. 1B of the first embodiment. Thereafter, as shown in FIG. 8B, the first insulating film 26 and the contact layer 24 are removed as leaving the contact layer 24 and the first insulating film 26 in the region where the mesa 30 is to be formed. Then, the mesa 30 is formed by etching the semiconductor layers from the window layer 22 so as to expose the connecting layer 12 using the ICP-RIE. Thereafter, the steps shown in FIG. 2B to FIG. 3B of the first embodiment are carried out.

Thus, the first insulating film 26, which is prepared for diffusing the p-type dopants, may be used as a mask for etching the semiconductor layers to form the mesa 30. The process according to the third embodiment may also prevent the mesa 30 from causing roughness in the top thereof. Moreover, because the first insulating film 26 is used as the etching mask, the process may be considerably simplified.

The embodiments thus described concentrate on the light-receiving device with the type of APD, the process according to the present invention may be applicable to form a photodiode with other types such as a PIN photodiode. Because an APD is biased with a high voltage to multiply carriers, an APD easily causes, what is called, the edge breakdown. Accordingly, the process of the present invention to form the guard ring region in the periphery of the mesa 30, or to hide the edge of the multiplication layer 20 from the side of the mesa 30, is most preferable to an APD.

The first to third embodiment thus described also concentrate on the circular shape of the mesa 30. However, the mesa 30 in a plane shape thereof is not restricted to a circular shape. The mesa may have an elliptic shape and/or a rectangular shape. Also, APDs of the embodiments have a configuration where the layers with the n-type conduction are provided lower while the layers with the p-type conduction are provided thereon. However, an APD may have an arrangement where the p-type conduction is in a lower; while, the n-type conduction is provided thereon. Also, the APD thus described has a configuration of the back illumination where photons enter from the back surface of the substrate, another APD may have an arrangement of the front illumination where the electrode in the top of the mesa has a doughnut shape and photons enter from the window layer through an opening of the doughnut shape. Even such arrangements, the guard ring region that prevents the edge of the multiplication layer from being exposed in the side of the mesa may effectively protect the mesa from the edge breakdown.

In the foregoing detailed description, the processes according to the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

The present application claims the benefit of priority of Japanese Patent Application No. 2017-038793, filed on Mar. 1, 2017, which is incorporated herein by reference.

What is claimed is:

1. A process of forming a light-receiving device, the process comprising:
   growing semiconductor layers on a semiconductor substrate, the semiconductor layers providing a first area;
   forming a first insulating film covering the first area;
   thermally diffusing impurities within the semiconductor layers in a second area outside of the first area so as to leave a roughened surface in a top of the second area, the impurities laterally diffusing to form a diffusion edge located inside of the first area;
   removing the first insulating film after the thermally diffusing the impurities;
   forming a second insulating film with an edge inside of an edge of the first insulating film but outside of the diffusion edge of the impurities; and
   removing the semiconductor layers in the second area including the roughened surface thereof to form a mesa in the first area, the mesa including the diffusion edge in a periphery thereof but excluding the roughened surface,
   wherein the forming the first insulating film is performed before the thermally diffusing the impurities,
   wherein the thermally diffusing the impurities is carried out using the first insulating film as a diffusion mask,
   wherein the removing the first insulating film and the forming the second insulating film are conducted after the thermally diffusing the impurities but before the removing the semiconductor layers,
   wherein the removing the semiconductor layers includes etching the semiconductor layers from the semiconductor layers side in a thickness direction of the semiconductor substrate, and wherein the removing the semiconductor layers is carried out by etching the semiconductor layers using the second insulating film as an etching mask.

2. The process according to claim 1,
wherein the light-receiving device has a type of avalanche photodiode (APD) and the semiconductor layers includes a window layer, a multiplication layer, and an absorption layer from a top thereof in this order, and
wherein the thermally diffusing the impurities diffuses the impurities at least within the window layer and the multiplication layer.

3. The process according to claim 2,
wherein the window layer and the multiplication layer are made of p-type indium phosphide (InP) and n-type InP, respectively, and the absorption layer is made of n-type InGaAs.

4. The process according to claim 2,
wherein the semiconductor layers further includes an intermediate layer and a buffer layer between the multiplication layer and the absorption layer in this order from the multiplication layer, the intermediate layer moderating strength of an electric field in the multiplication layer, the buffer layer moderating bandgap discrepancy between the multiplication layer and the absorption layer, and
wherein the thermally diffusing the impurities diffuses the impurities within the window layer, the multiplication layer, and the intermediate layer but the buffer layer.

5. The process according to claim 4,
wherein the intermediate layer is made of n-type InP and the buffer layer is made of InGaAsP.

6. The process according to claim 2,
wherein the semiconductor layers further includes a contact layer made of heavily doped InGaAs on the window layer, and
wherein the process further includes:
removing a portion of the contact layer in the second area to expose the top of the window layer in the second area, where the thermally diffusing the impurities uses the contact layer as a diffusion mask; and
removing a portion of the contact layer so as to form an edge of the contact layer inside of the edge of the diffusion edge of the impurities.

7. The process according to claim 1,
wherein the thermally diffusing the impurities is carried out within an atmosphere containing zinc (Zn) under a pressure lower than $3.0\times10^{-3}$ Torr and a temperature of higher than 600° C. for at least 80 minutes.

8. A process of forming a light-receiving device, the process comprising:
growing semiconductor layers on a semiconductor substrate, the semiconductor layers providing a first area;
thermally diffusing impurities within the semiconductor layers in a second area outside of the first area so as to leave a roughened surface in a top of the second area, the impurities laterally diffusing to form a diffusion edge located inside of the first area; and
removing the semiconductor layers in the second area including the roughened surface thereof to form a mesa in the first area, the mesa including the diffusion edge in a periphery thereof but excluding the roughened surface,
wherein the removing the semiconductor layers includes etching the semiconductor layers from the semiconductor layers side in a thickness direction of the semiconductor substrate,
wherein the light-receiving device has a type of avalanche photodiode (APD) and the semiconductor layers includes a window layer, a multiplication layer, and an absorption layer from a top thereof in this order,
wherein the thermally diffusing the impurities diffuses the impurities at least within the window layer and the multiplication layer, and
wherein the semiconductor layers further includes an intermediate layer and a buffer layer between the multiplication layer and the absorption layer in this order from the multiplication layer, the intermediate layer moderating strength of an electric field in the multiplication layer, the buffer layer moderating bandgap discrepancy between the multiplication layer and the absorption layer.

9. The process according to claim 8,
wherein the window layer and the multiplication layer are made of p-type indium phosphide (InP) and n-type InP, respectively, and the absorption layer is made of n-type InGaAs.

10. The process according to claim 8,
wherein the intermediate layer is made of n-type InP and the buffer layer is made of InGaAsP.

11. The process according to claim 8,
wherein the semiconductor layers further includes a contact layer made of heavily doped InGaAs on the window layer, and
wherein the process further includes steps of:
removing a portion of the contact layer in the second area to expose the top of the window layer in the second area, where the thermally diffusing the impurities uses the contact layer as a diffusion mask; and
removing a portion of the contact layer so as to form an edge of the contact layer inside of the edge of the diffusion edge of the impurities.

12. The process according to claim 8,
wherein the thermally diffusing the impurities is carried out within an atmosphere containing zinc (Zn) under a pressure lower than $3.0\times10^{-3}$ Torr and a temperature of higher than 600° C. for at least 80 minutes.

13. A process of forming a light-receiving device, the process comprising:
growing semiconductor layers on a semiconductor substrate, the semiconductor layers providing a first area;
thermally diffusing impurities within the semiconductor layers in a second area outside of the first area so as to leave a roughened surface in a top of the second area, the impurities laterally diffusing to form a diffusion edge located inside of the first area; and
removing the semiconductor layers in the second area including the roughened surface thereof to form a mesa in the first area, the mesa including the diffusion edge in a periphery thereof but excluding the roughened surface,
wherein the removing the semiconductor layers includes etching the semiconductor layers from the semiconductor layers side in a thickness direction of the semiconductor substrate, and
wherein the thermally diffusing the impurities is carried out within an atmosphere containing zinc (Zn) under a pressure lower than $3.0\times10^{-3}$ Torr and a temperature of higher than 600° C. for at least 80 minutes.

* * * * *